US007164905B2

(12) United States Patent
Tamaki et al.

(10) Patent No.: US 7,164,905 B2
(45) Date of Patent: *Jan. 16, 2007

(54) HIGH FREQUENCY MODULE

(75) Inventors: Tsutomu Tamaki, Tokyo (JP); Takuya Suzuki, Tokyo (JP); Koichi Matsuo, Tokyo (JP); Hiroshi Kai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/070,231

(22) Filed: Mar. 3, 2005

(65) Prior Publication Data

US 2005/0140470 A1 Jun. 30, 2005

Related U.S. Application Data

(63) Continuation of application No. 09/934,481, filed on Aug. 23, 2001, now Pat. No. 6,876,846.

(30) Foreign Application Priority Data

Aug. 24, 2000 (JP) .............................. 2000-254115

(51) Int. Cl.
*H04M 11/00* (2006.01)
*H04Q 7/20* (2006.01)
(52) U.S. Cl. .................. 455/403; 455/189.1; 455/293; 455/311; 455/313; 455/323; 333/247
(58) Field of Classification Search ................ 455/313, 455/311, 323, 293, 189.1, 403; 333/247
See application file for complete search history.

(56) References Cited

U.S. PATENT DOCUMENTS

| 5,438,305 | A | * | 8/1995 | Hikita et al. ................... 333/32 |
| 6,369,676 | B1 | | 4/2002 | Sakamoto et al. |
| 6,388,623 | B1 | * | 5/2002 | Sakota et al. ........ 343/700 MS |
| 6,625,037 | B1 | | 9/2003 | Nakatani et al. |
| 2001/0054944 | A1 | * | 12/2001 | Sakamoto et al. ....... 333/219.1 |
| 2002/0036054 | A1 | * | 3/2002 | Nakatani et al. ............ 156/233 |

FOREIGN PATENT DOCUMENTS

| JP | 2-69967 | 3/1990 |
| JP | 8-18002 | 1/1996 |

* cited by examiner

*Primary Examiner*—Steve M. D'Agosta
(74) *Attorney, Agent, or Firm*—Buchanan Ingersoll & Rooney PC

(57) ABSTRACT

Heretofore, a plurality of packages were used in a high frequency module in which a plurality of waveguide terminals were positioned resulting in problems, such as degradation of characteristics in the connection lines between packages, lower ease of assembly when mounting and connecting the connection lines, increased cost, and so forth. To solve these problems, a plurality of cavities having a part or the entire side metallized is formed in a multi-layer dielectric substrate. The multi-layer dielectric substrate is provided with a plurality of waveguide terminals, microstrip line-waveguide converters, RF lines, bias and control signal wiring, and bias and control signal pads. A high frequency circuit is mounted within the cavity and sealed with a seal and cover. This is intended to reduce the number of package, improve performance, improve fabrication, and lower the cost.

9 Claims, 12 Drawing Sheets

HIGH FREQUENCY MODULE

This application is a continuation of application Ser. No. 09/934,481, filed on Aug. 23, 2001 now U.S. Pat. No. 6,876,846.

BACKGROUND OF THE INVENTION

1. Field of the Invention

The present invention relates to a high frequency module for use with high frequency band, such as the microwave band or millimeter-wave band, applications, such as in a radar apparatus, communications apparatus, or other apparatus operating in a high frequency band.

2. Description of the Prior Art

FIG. 1 is a perspective view of a conventional high frequency module. FIG. 1 shows a metal chassis 1; a waveguide terminal 2 for carrying high frequency RF signals, such as microwave signals, along the substrate thickness of the chassis 1, to and from a waveguide (not shown in the figure) connected to the bottom surface of the chassis 1; a package 3 including a high frequency circuit; and connection lines 4 for carrying RF signals and consisting of a dielectric substrate formed with microstrip lines on the top surface. FIG. 2 shows the configuration of the package 3, with the right side a perspective view of the package 3 and the left side a perspective exploded view of the package. The package 3 comprises a carrier 5 provided underneath the package 3; dielectric substrates 6 mounted on the carrier 5; a feed-through terminal 7 for carrying RF signals between a high frequency circuit 9 and the connection line 4 and enabling the maintaining an airtight atmospheric integrity for the package 3; a seal 8 having a frame shape and made of metal; the high frequency circuit 9, such as a monolithic microwave IC (MMIC) or high frequency resistor; bias and control signal pins 10 for inputting and outputting DC signals from and to the high frequency circuit 9; and a metal cover 11 joined onto the top surface of the seal 8.

The configuration of such a conventional high frequency module will be described next. The conventional high frequency module shown in FIG. 1, comprises a plurality of packages 3, which are connected via connection lines 4, positioned on the chassis 1 having a plurality of the waveguide terminals 2. Furthermore, the package 3 has laminated onto the metal carrier 5 a plurality of the dielectric substrates 6, on which the feed-through terminal 7 and the seal 8 are positioned, in such a manner that a cavity is provided within the seal 8. In this cavity is mounted the high frequency circuit 9. A slot is provided in the side of the seal, and in this slot the feed-through is positioned and sealed so that RF signals can be communicated to and from the connection lines 4, while maintaining the atmospheric integrity inside the package 3. Furthermore, the connection lines 4 are connected to the waveguide terminals 2 to carry RF signals between the high frequency circuit 9 and the waveguide terminals 2. The RF signals carried from the connection lines 4 to the waveguide terminals 2 are carried within the waveguide terminals 2 in waveguide mode, and the bias and control signals to the high frequency circuit 9 are obtained via the bias and control signal pins 10 provided underneath the dielectric substrate 6. The cover 11 is then joined onto the seal 8 by soldering, adhesion, or resistance welding, to seal the package 3. However, because a plurality of packages 3 are positioned on the chassis 1 in this manner, the signal loss due to the connection lines 4 for connecting between the respective packages is large and the performance as a high frequency module degrades. Furthermore, when positioning the connection lines 4 on a chassis as large as the chassis 1 and connecting the packages 3 with the connection lines 4, connection is commonly performed by applying wire bonding using thermo-compression bonding, which introduces unfavorable assembly operations, such as, for example, the heating of the entire chassis 1 to a temperature of 150° C. for a long heating time, poor handling of the chassis 1, and so forth. Furthermore, even where a plurality of the packages 3 are used, cost reduction is difficult. Even when the plurality of packages have a common function, each package must still be individually equipped with that same function. In other words, a common function cannot be integrated, and cost can not be lowered through mass production. Therefore, conventional high frequency modules have problems such as performance degradation, unfavorable assembly operations, and high cost.

As described above, because conventional high frequency modules comprise a plurality of packages, problems include the degradation of characteristics in the connection lines; unfavorable assembly operations during mounting and connection of the connection lines; high cost; and so forth.

SUMMARY OF THE INVENTION

In light of the above, it is an object of the present invention to solve these problems, and, in a high frequency module having a plurality of waveguide terminals, to reduce the number of packages inside comprising high frequency circuits, improve performance, simplify assembly operations, and lower overall cost.

One aspect of the present invention is a high frequency module comprising a first dielectric substrate provided with transmission lines for carrying bias signals or IF signals, and a first and a second waveguides; a second dielectric substrate laminated on the first dielectric substrate and provided with the first and second waveguides, and a first and a second cavity positioned apart from each other; a third dielectric substrate laminated on the second dielectric substrate and having a third cavity, inside which is positioned the first cavity, and a fourth cavity, inside which is positioned the second cavity, positioned apart from the third cavity and having a slot for communicating to the third cavity, with the first and second waveguides respectively provided outside the third and fourth cavities; a metal conductor provided so as to seal the third and fourth cavities; a plurality of first high frequency circuits installed within the first cavity and connected to the transmission lines via through-holes provided on the second dielectric substrate; a plurality of second high frequency circuits installed within the second cavity and connected to the transmission lines via through-holes provided on the second dielectric substrate; a first connection line provided within the communicating slot and connected between the first and second high frequency circuits; and a second and a third connection line for respectively connecting the first and the second high frequency circuits with the first and second waveguides.

According to this first aspect of the present invention, the high frequency module configured in the related art from a plurality of packages can be integrated so as to obviate connection lines between the packages, thereby enabling miniaturization of the high frequency module, improvement in the ease of assembly, performance improvement, cost reduction, and so forth.

Furthermore, in a second aspect of the present invention, the above-mentioned second and third connection lines carry signals on the front and back sides of the above-mentioned second dielectric substrate between the connection lines carrying RF signals and the waveguides carrying RF signals.

Furthermore, in a third aspect of the present invention, the above-mentioned second and third connection lines are positioned within the slot formed in the above-mentioned third dielectric substrate, and are coupled to waveguides formed by through-holes provided on the above-mentioned first and second dielectric substrate.

According to the second and third aspects, feed-throughs are obviated, the configuration can be simplified, and signal loss due to feed-throughs can be reduced, thereby enabling further improvement in the characteristics.

Furthermore, in a fourth aspect of the present invention, the element corresponding to the third dielectric substrate in the above-mentioned first aspect can be configured from a metal conductor.

According to this configuration, the first and second cavities in the first aspect are configured from a metal conductor and space is ensured to provide a slot including the first connection line so that coupling of high frequency signals between cavities can be further suppressed, thereby enabling further improvement in the characteristics.

Furthermore, according to a fifth aspect of the present invention, on the bottom surface of the high frequency module is provided a metal carrier having a coupling member for coupling with external apparatus.

According to this configuration, the degree of freedom of mechanical fastening with another apparatus, such as an antenna, increases and fastening is simplified, thereby increasing the degree of freedom in the design and improving the ease of assembly.

Furthermore, according to a sixth aspect of the present invention, a plurality of holes having continuity to ground are provided near the periphery of one cavity of the above-mentioned first to fourth cavities so as to enclose the cavity.

According to this configuration, metallization can be easily obtained for suppressing leakage of RF signals.

Furthermore, according to a seventh aspect of the present invention, a plurality of through-holes split vertically in half and having continuity to ground is embedded in the periphery of one cavity of the above-mentioned first to fourth cavities.

According to this configuration, the hole spacing can be shortened in comparison to the configuration of the sixth aspect so that leakage of RF signals can be further suppressed.

Furthermore, in an eighth aspect of the present invention, the high frequency module comprises a first oscillator for outputting a high frequency modulating signal; a power divider for dividing the power of the output of the above-mentioned first oscillator; a multiplier for doubling the frequency of one output of the above-mentioned power divider and outputting a transmitting signal; a second oscillator for outputting an intermediate frequency signal into two directions; an even harmonic high frequency mixer for outputting a signal having frequencies of the sum and difference of the doubled frequency of the other output of the above-mentioned power divider and the output frequency of the above-mentioned second oscillator; amplifiers positioned to correspond to the number of existing waveguides and for performing low-noise amplification of receiving signals obtained from respective waveguides; a power combiner for combining the power of the outputs of the above-mentioned waveguides; a first fundamental mixer for receiving and converting the frequency of the output of the above-mentioned power combiner and the output of the above-mentioned even harmonic high frequency mixer and outputting an IF signal; and a second fundamental mixer for receiving and converting the frequency of the IF signal that is output from the above-mentioned first fundamental mixer and the other output of the above-mentioned second oscillator and outputting a video signal; wherein the above-mentioned first oscillator, power divider, multiplier, even harmonic high frequency mixer, amplifiers, and first fundamental mixer are mounted within the above-mentioned first and second cavities.

Furthermore, in a ninth aspect of the present invention, the high frequency module comprises an oscillator for outputting a high frequency modulating signal; a power divider for dividing the power of the output of the above-mentioned oscillator; a multiplier for doubling the frequency of one output of the above-mentioned power divider and outputting a transmitting signal; a switch having a number of channels corresponding to the plurality of waveguides obtaining receiving signals and capable of selecting the waveguide; and an even harmonic high frequency mixer for outputting a video signal having frequencies of the sum and difference of the doubled frequency of the other output of the above-mentioned power divider and the output frequency of the above-mentioned switch; wherein the above-mentioned oscillator, power divider, multiplier, switch, and even harmonic high frequency mixer are mounted within the above-mentioned first and second cavities.

Furthermore, in a tenth aspect of the present invention, the high frequency module comprises a first oscillator for outputting a high frequency modulating signal; a power divider for dividing the power of the output of the above-mentioned oscillator; a multiplier for doubling the frequency of one output of the above-mentioned power divider and outputting a transmitting signal; a second oscillator for outputting an intermediate frequency signal into two directions; an even harmonic high frequency mixer for outputting a signal having frequencies of the sum and difference of the doubled frequency of the other output of the above-mentioned power divider and the output frequency of the above-mentioned second oscillator; a switch having a number of channels corresponding to a plurality of the waveguides obtaining receiving signal and capable of selecting the waveguide; a first fundamental mixer for receiving and converting the frequency of the output of the above-mentioned switch and the output of the above-mentioned even harmonic high frequency mixer and outputting an IF signal; and a second fundamental mixer for receiving and converting the frequency of the IF signal that is output from the above-mentioned fundamental mixer and the other output of the above-mentioned second oscillator and outputting a video signal; wherein the above-mentioned first oscillator, power divider, multiplier, even harmonic high frequency mixer, switch, and first fundamental mixer are mounted within the above-mentioned first and second cavities.

Furthermore, in an eleventh aspect of the present invention, the high frequency module comprises an oscillator for outputting a high frequency modulates signal; an N-multiplier for multiplying by N times (where N is an integer greater than or equal to 2) the output frequency of the above-mentioned oscillator; a power divider for dividing the power of the output of the above-mentioned N-multiplier; a multiplier for doubling the frequency of the other output of the above-mentioned power divider and outputting a transmitting signal; a switch having a number of channels corresponding to a plurality of the waveguides obtaining receiving signals and capable of selecting the waveguide; and n even harmonic high frequency mixer for outputting a video signal having frequencies of the sum and difference of the doubled frequency of the other output of the above-mentioned power divider and the frequency of the receiving signal obtained through the above-mentioned switch; wherein the above-mentioned oscillator, power divider, multiplier, N-multiplier, switch, and even harmonic high frequency mixer are mounted within the above-mentioned first and second cavities.

When applied to a FM-CW radar using a plurality of receiving antennas through switching, the device according to the eighth to eleventh aspects, can result in a radar of miniature size, low cost, and with high performance.

Furthermore, in a twelfth aspect of the present invention, the high frequency module comprises an oscillator for outputting a high frequency modulating signal; a power divider for dividing the power of the output of the above-mentioned oscillator; a multiplier for doubling the frequency of one output of the above-mentioned power divider and outputting a transmitting signal; a switch having a number of channels corresponding to a plurality of the waveguides for outputting transmitting signals and capable of selecting the waveguide and conducting the transmitting signal; and an even harmonic high frequency mixer for outputting a video signal having frequencies of the sum and difference of the doubled frequency of the other output of the above-mentioned power divider and the frequency of the receiving signal obtained from waveguide different from above-mentioned waveguide; wherein the above-mentioned oscillator, power divider, multiplier, switch, and even harmonic high frequency mixer are mounted within the above-mentioned first and second cavities.

When this configuration is applied to a FM-CW radar using a plurality of transmitting antennas through switching, a radar can be implemented in a miniature size, at low cost, and with high performance.

DETAILED DESCRIPTION OF THE PREFERRED EMBODIMENTS

Embodiment 1

Figure 1:
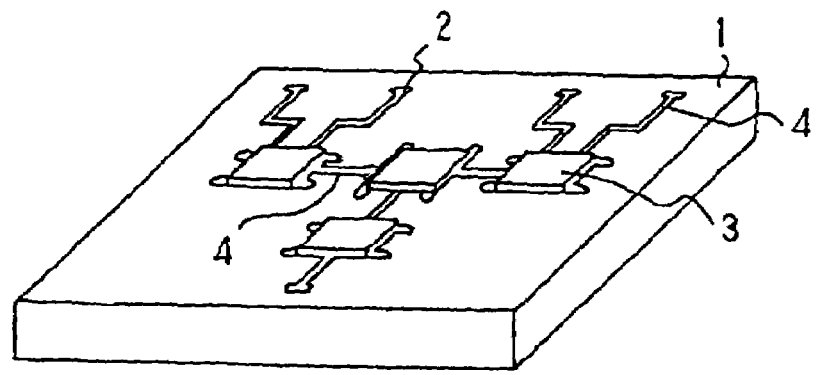
FIG. 1 is a perspective view of a conventional high frequency module.
Figure 2:
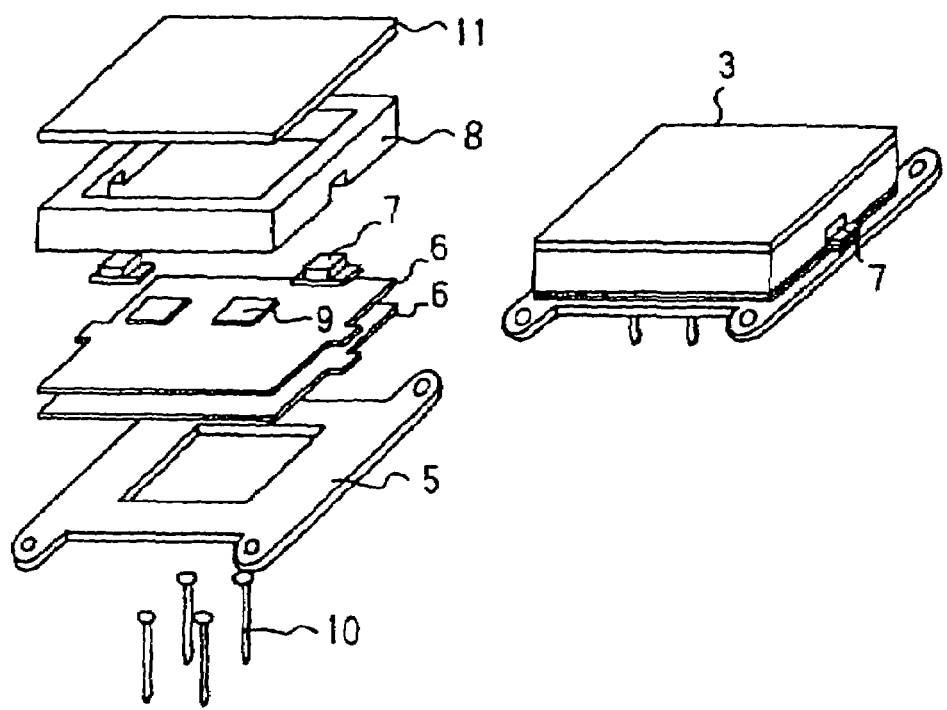
FIG. 2 shows the configuration of a conventional package.
Figure 3:
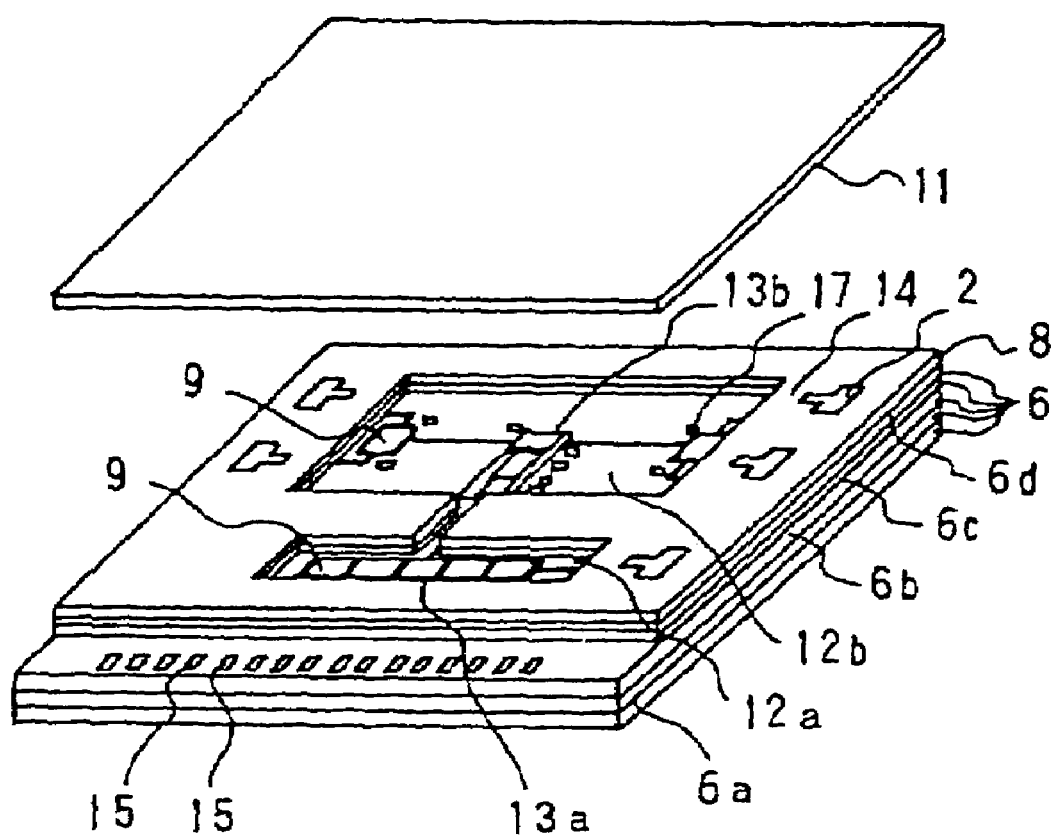
FIG. 3 is a perspective view of a high frequency module according to an Embodiment 1 of the present invention.

FIG. 3 is a perspective view of a high frequency module representing Embodiment 1 of the present invention. In this figure are shown a plurality of waveguide terminals 2 for carrying high frequency RF signals, such as microwave or millimeter-wave signals; a dielectric substrate 6 formed from laminating a plurality of dielectric substrates, consisting of, for example, a ceramic-based material; a seal 8 joined on top of the dielectric substrate 6 and having a plurality of holes forming cavities together with the dielectric substrate 6 and consisting of a metal conductor, such as Kovar (Kv); high frequency circuits 9, such as an MMIC (Monolithic Microwave IC) or a high frequency resistor; a cover 11 for joining to the top of the seal 8 and consisting of a metal conductor, such as Kovar (Kv); a first cavity 12 formed in the dielectric substrate 6 and consisting of a plurality (two shown in the figure as 12a and 12b) of cavities connected by a feed-through slot and positioned so as to be separated by a partition wall through which passes the feed-through slot; a second cavity 13 formed in the dielectric substrate 6 and consisting of a plurality (four shown in the figure as 13a, 13b, 13c, and 13d) of cavities separated from each other by partitions and positioned inside each first cavity 12; a feed-through 14 provided in the dielectric substrate 6 for carrying RF signals between the waveguide terminals 2 and the high frequency circuits 9 while maintaining an airtight seal; bias and control signal pads 15 for inputting and outputting IF signals or DC signals; and bonding pads 17 for bias and control signals for connecting to the high frequency circuits 9 through ribbon or connection wires made of a material such as gold or silver.

Figure 4:
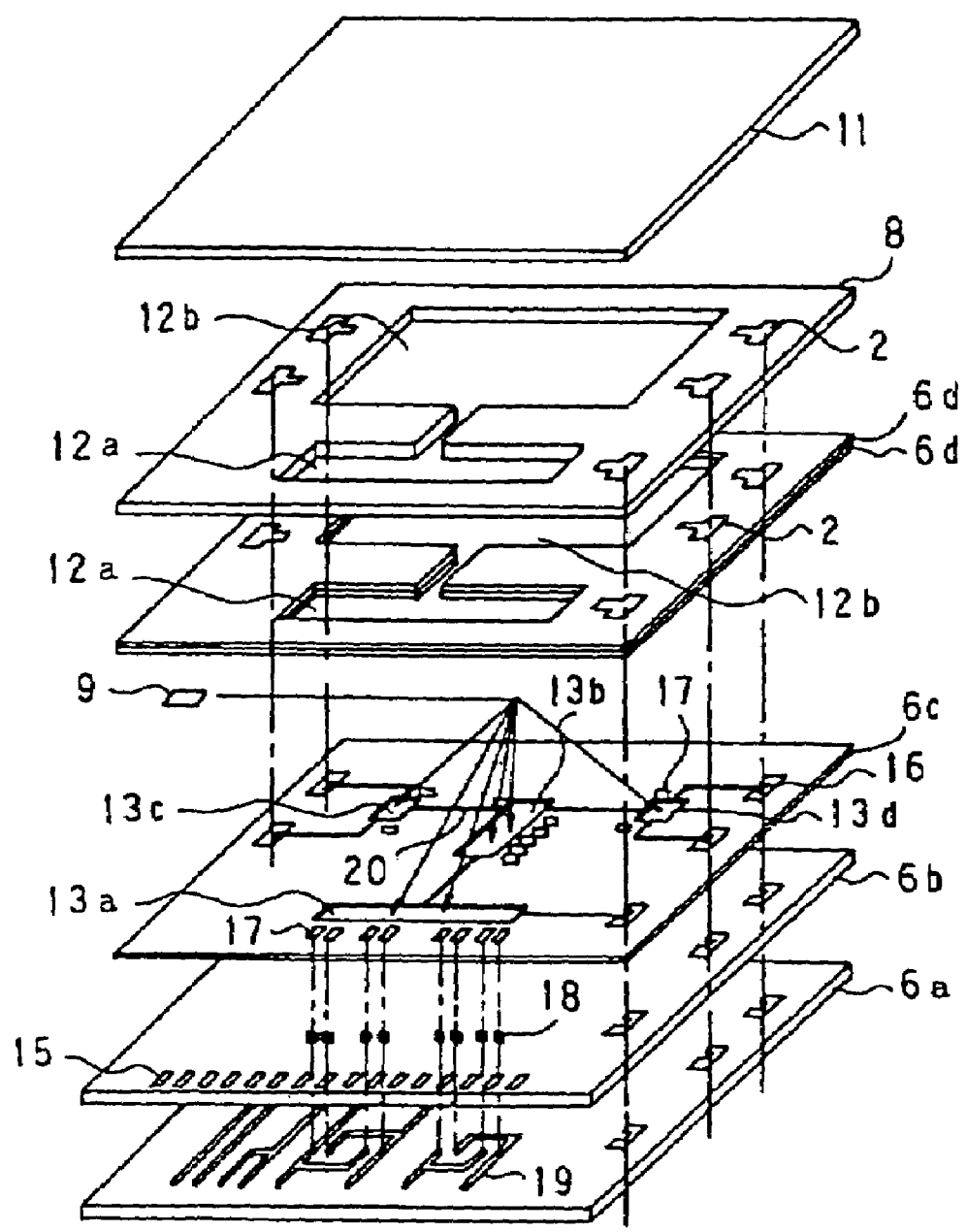
FIG. 4 is a perspective exploded view of the high frequency module according to Embodiment 1.

Furthermore, FIG. 4 is a perspective exploded view of the example high frequency module according to Embodiment 1 of the present invention. In this figure are shown a dielectric substrate 6a positioned at the bottom layer of the dielectric substrate 6, a dielectric substrate 6b laminated onto the dielectric substrate 6a on which are formed bias and control signal pads 15, a dielectric substrate 6c laminated onto the dielectric substrate 6b in which are formed the second cavities 13, a dielectric substrate 6d laminated onto the dielectric substrate 6c in which are formed the first cavities 12, and a microstrip-waveguide converter 16 formed by providing a microstrip line on a tongue-shaped dielectric substrate provided in the periphery of a U-shaped hole formed in the dielectric substrate 6c. The U-shaped hole, together with holes formed in the same shape in the dielectric substrates 6a and 6b, forms a waveguide for the waveguide terminal 2. Furthermore, a T-shaped hole is formed in the dielectric substrate 6d and in the seal 8. This T-shaped hole connects to the waveguide of the above-mentioned waveguide terminal 2 and forms the waveguide terminal 2 carrying the RF signals from the microstrip-waveguide converter 16 downward along the thickness of the dielectric substrate 6 to a waveguide (not shown) connected to the bottom of the dielectric substrate, and carrying the RF signals from the waveguide connected to the bottom of the dielectric substrate 6 upward along the thickness of the dielectric substrate 6 to the microstrip-waveguide converter 16. FIG. 4 also shows bias and control signal through-holes 18 provided in the dielectric substrates 6*b* and 6*c*, bias and control signal wiring 19 provided on the dielectric substrate 6*a*, and RF lines 20 formed in the dielectric substrate 6*c*.

The configuration and function will be described next. In the figure, the waveguide terminals 2, the first cavities 12, and the second cavities 13 are formed within the high frequency module by laminating the dielectric substrates 6*a* to 6*d* provided partially with holes to form a plurality of cavities and waveguides. This lamination is performed by heating and sintering a soft ceramic-based dielectric substrate, through, for example, a low temperature co-fired ceramic (LTCC) process. The first cavities 12 have a space formed above the high frequency circuit 9 positioned internally and part or the entire side and part of the bottom surface metallized so as to suppress coupling of the high frequency signals between the cavities (12*a* and 12*b* in the figure) that connect through the feed-through slot. The second cavities 13 are metallized on part or the entire side and the entire bottom surface, and the high frequency circuit 9 is positioned internally. Wire connection, ribbon bonding, or the like is performed to respectively transfer bias and control signals and RF signals between the high frequency circuits 9 and the bias and control signal bonding pads 17 and the RF lines 20 positioned in the periphery of each cavity (13*a*, 13*b*, 13*c*, and 13*d* in the figure) separated from each other by partitions. Certain of the RF lines 20 are connected to the feed-through 14 that is formed by lamination of the dielectric substrates 6*c* and 6*d*, and then connected to the microstrip line-waveguide converter 16 that is formed by the laminated dielectric substrate 6 for efficient conduction to the waveguide terminal 2. Using the feed-through 14 enables RF signals to be carried between the waveguide terminal 2 and the high frequency circuit 9 while maintaining an airtight seal between the first cavity 12 and the waveguide terminal 2. The waveguide terminal 2 is connected to another airtight waveguide (not shown in the figure) underneath the dielectric substrate 6. Furthermore, the remaining RF lines 20 are wired between the second cavities 13 (shown in the figure between 13*a* and 13*b*, 13*b* and 13*c*, 13*b* and 13*d*) and transfer signals between the cavities. At the second cavities 13 (13*a*, 13*b*, 13*c*, and 13*d* in the figure), a plurality of high frequency circuits 9 is positioned in the same cavity and the high frequency circuits 9 are each connected by wire bonding or ribbon bonding. At this time, the high frequency circuits are selectively positioned so as to prevent interference and to gather circuits having similar functions, for example by collectively positioning circuits operating at the same frequency band into the same cavity, or collectively positioning, so as not to mix the receiving and transmitting systems, the high frequency circuits for receiving and the high frequency circuits for transmitting into respective corresponding cavities. The bias and control signals from the bias and control signal bonding pads 17 are connected to the bias and control signal pads 15 via the dielectric substrate 6, between and within the layers, through the bias and control signal through-holes 18, the bias and control signal wiring 19, and so forth, so that IF signals and DC signals are transferred with an external circuit (not shown in the figure). The seal 8 is then positioned onto the laminated dielectric substrate 6, on top of which the cover 11 is joined by, for example, bonding, soldering, or welding (such as resistance welding), to form an airtight seal. The seal 8 is joined on the top surface of the dielectric substrate 6*d* and is also formed with the first cavities 12, and further the metal cover 11 is joined on the top surface of the seal 8 so as to suppress coupling of RF signals between cavities.

As described further above, a conventional high frequency module comprised a plurality of packages that included a plurality of high frequency circuits. In contrast, in the device of the present embodiment is positioned a plurality of high frequency circuits within a cavity formed in the laminated dielectric substrates. Therefore, integration is possible without the use of an extra chassis for the package, and the connection lines between packages become unnecessary, thereby enabling the miniaturization of the high frequency module. Furthermore, compared to the above-described package, a small-sized high frequency circuit is positioned in the cavity and connected by wire bonding or ribbon bonding so as to shorten the heating time during bonding and facilitate handling after heating, thereby improving the assembly operation.

Furthermore, in each package, circuit and lines having functions in common can be connected using the same lines, and the feed-throughs for connecting between packages via the connection lines for RF signals become unnecessary so that it becomes possible to reduce the cost as well as to improve the characteristics, such as due to the reduction in signal loss at the feed-through.

Embodiment 2

Figure 5:
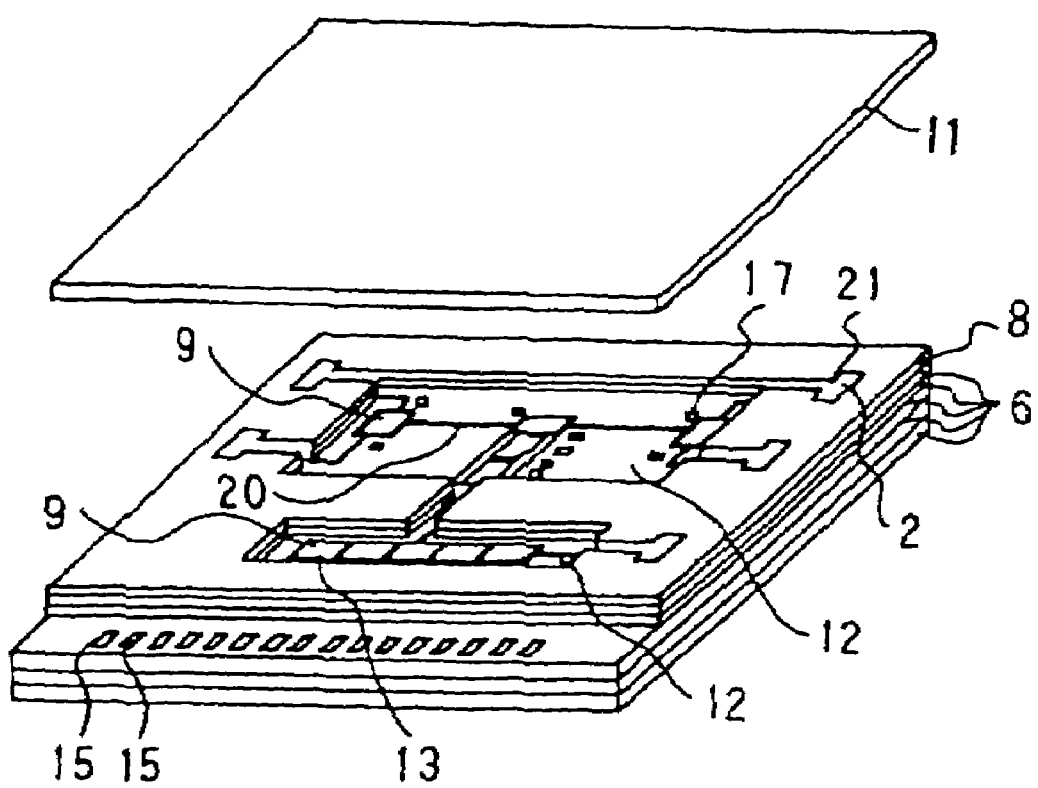
FIG. 5 is a perspective view of a high frequency module according to an Embodiment 2 of the present invention.

FIG. 5 is a perspective view of an example high frequency module illustrating an Embodiment 2 of the present invention. In the figure, components corresponding or equivalent to those in Embodiment 1 are designated using identical reference numerals. A component designated by reference numeral 21 is a microstrip line-waveguide converter for carrying signals on the front and back sides of the dielectric substrate.

The configuration and function will be described next. As shown in the figure, the waveguide terminals 2, the first cavities 12, and the second cavities 13 are formed within the high frequency module by laminating then sintering a plurality of the dielectric substrates 6 provided partially with holes to form a plurality of cavities and waveguides in a manner similar to that described above for Embodiment 1. The first cavities 12 have a space formed above the internal high frequency circuit 9 and have part or the entire side and part of the bottom surface metallized so as to suppress coupling of the high frequency signals between the cavities. The second cavities 13 are metallized on part or the entire side and the entire bottom surface, and the high frequency circuit 9 is positioned internally. Wire connection, ribbon bonding, or the like is performed to respectively transfer bias and control signals and RF signals between the high frequency circuits 9 and the bias and control signal bonding pads 17 and the RF lines 20 positioned in the periphery of the cavities. Certain RF lines 20 are connected to the microstrip line-waveguide converter 21 for carrying signals on the front and back sides of the dielectric substrate formed by the laminated dielectric substrate 6 for efficient conduction to the waveguide terminal 2.

The microstrip line-waveguide converter 21 may be configured in the following manner. A slot is provided in part of the wall surface (wall surface formed by the fourth dielectric substrate 6*d* and the seal 8) surrounding the periphery of the first cavity 12, this slot is connected to a rectangular hole formed in the seal 8 and in the fourth dielectric substrate 6*d* provided above the waveguide terminal 2, and the microstrip line is provided on the bottom surface of the above-mentioned slot (top surface of the third dielectric substrate 6*c*).

The rectangular hole formed in the dielectric substrate 6*d* and the seal 8 form one end of the waveguide terminal 2, while the other end of the waveguide terminal 2 is formed by a waveguide provided cylindrically within the dielectric substrates 6*a*, 6*b*, and 6*c*. A plurality of through-holes all pass through the dielectric substrates 6*a*, 6*b*, and 6*c* and are arranged in a rectangular shape along the periphery of the above-described rectangular hole, a metal conductor is positioned in a slot shape in the dielectric substrate 6*c* so as to enclose a contour formed by connecting between adjacent through-holes, and a cylindrical waveguide enclosed by through-holes is formed along the thickness of the dielectric substrates 6*a* and 6*b*. The microstrip line on the bottom surface of the slot formed on the dielectric substrate 6*c* is electromagnetically coupled with the waveguide and carries RF signals between the high frequency circuit 9 and the waveguide terminal 2. The RF signals travel within the waveguide terminal 2 in waveguide mode. At this time, the opening at the other end of the waveguide terminal 2 is formed by the waveguide enclosed by through-holes provided in the dielectric substrate. In other words, the opening of the waveguide is formed without opening a hole in the dielectric substrate, and is then made airtight by the lamination of the dielectric substrates 6.

Furthermore, the other RF lines 20 are wired between the second cavities 20 and transfer signals between the cavities. The bias and control signals (not shown in the figure) from the bias and control signal bonding pads 17 are connected to the bias and control signal pads 15 via the dielectric substrate 6, between and within the layers, through the bias and control signal through-holes 18, the bias and control signal wiring 19, and the like, and are transferred with an external circuit in an identical manner to FIG. 4 in embodiment 1. The seal 8 is then installed onto the laminated dielectric substrate 6, on top of which the cover 11 is joined by, for example, bonding, soldering, or welding, to thereby seal the cavity.

As a result, the high frequency module can be integrally configured without using the conventional plurality of packages including high frequency circuits and the connection lines between packages become unnecessary, thereby enabling the miniaturization of the high frequency module, streamlining of assembly operations, reduction in cost, and so forth. Furthermore, using the microstrip line-waveguide converter 21 for carrying signals on the front and back sides of the dielectric substrate obviates the need for a feed-through 14 at the connection with the waveguide so that the configuration can be simplified, and the characteristics can be further improved because signal loss due to the feed-through 14 can be eliminated.

Embodiment 3

Figure 6:
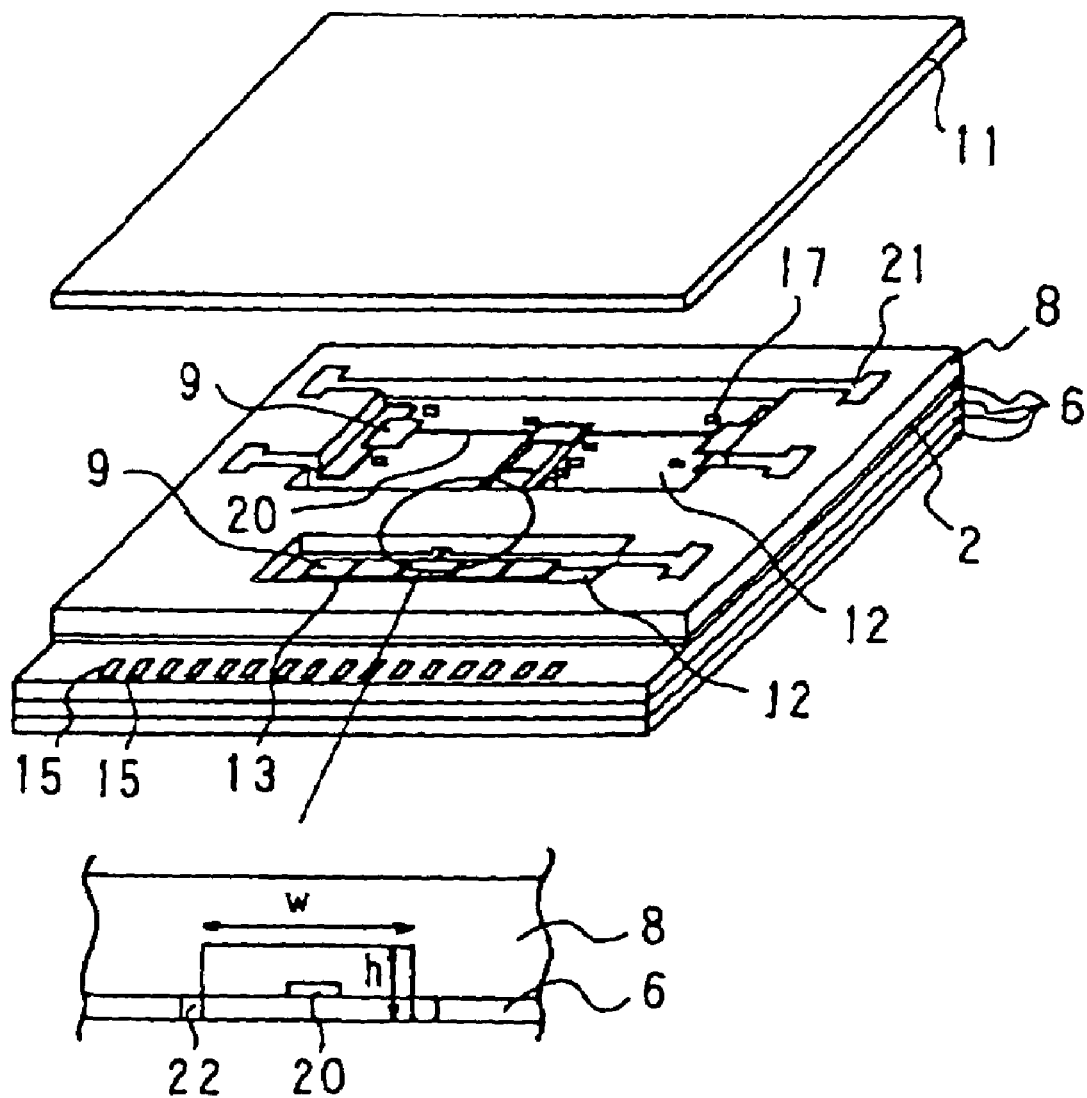
FIG. 6 is a perspective view of a high frequency module according to an Embodiment 3 of the present invention.

FIG. 6 is a perspective view of a high frequency module representing Embodiment 3 of this invention, and identical or equivalent components to those in the above-mentioned embodiments are designated with identical reference numerals. In the figure, reference numeral 22 designates a ground conduction through-hole.

The configuration and function will be described next. As shown in the figure, the waveguide terminals 2, the first cavities 12, and the second cavities 13 are formed within the high frequency module by laminating and then sintering a plurality of dielectric substrates 6 (6*a*, 6*b*, 6*c*) provided partially with holes to form a plurality of cavities and waveguides in a manner identical to embodiment 1, and further joining thereon, for example, by bonding, soldering, or welding, the seal 8 provided partially with holes to form a plurality of cavities and waveguides. The first cavities 12 make space above the internal high frequency circuit 9. The sides of the first cavities 12, formed by the metal conductor seal 8, suppress coupling of the high frequency signals between the cavities. The bottom surface and at least some portion of the side of the second cavities 13 are metallized and the high frequency circuit 9 is mounted therein. The high frequency circuit 9 is connected by wire or ribbon bonding to respectively transfer RF signals and bias and control signals with the RF lines 20 and the bias and control signal bonding pads 17 positioned in the periphery of the cavity. Some of the RF lines 20 are connected to the microstrip line-waveguide converter 21 for carrying signals on the front and back sides of the dielectric substrate formed by the laminated dielectric substrate 6 for efficient conduction to the waveguide terminal 2. Furthermore, the other RF lines 20 are connected between the second cavities 13 to transfer signals between the cavities. When connecting between the high frequency circuits 9 respectively positioned in the second cavities 13, it may be necessary to eliminate undesirable leakage signals while passing the RF signals between the first cavities 12. This can be achieved by the structure provided at the portion enclosed by the circle at the center of the high frequency module shown in FIG. 6. A cross-sectional view of this part is shown enlarged at the bottom of FIG. 6. As shown in the enlarged view at the bottom of FIG. 6, a slot having width W is provided in the underside of the seal 8, and the seal 8 is positioned on the dielectric substrate 6 to provide a tunnel-shaped space above the RF line 20. Furthermore, the ground conduction through-hole 22 is provided at the bottom of the side wall surface of the tunnel-shaped slot provided in the seal 8, i.e., at the joining surface near the corner of the slot of the dielectric substrate 6 and the seal 8 so as to form a waveguide having reduced dimensions, of which the height h, width w, and length L correspond to the desired frequency, thereby suppressing coupling of the high frequency signals between cavities. It is necessary to decrease the height h and the width w when setting a higher cut-off frequency, and to lengthen L so that the loss at the desired frequency increases at the formed waveguide. These L, h, and w should be appropriately selected in accordance with the mounting density, machining precision, and ease of machining (mountable space decreases as L lengthens and machining becomes difficult as h and w are reduced). It should be noted that when applying the present invention to a microwave band or millimeter-wave transceiver module having a transmitting system and a receiving system, it is possible to obtain a transceiver module having high isolation and lower interference between the transmitting system and receiving system by providing a tunnel-shaped slot in a partitioning wall between the cavity (such as 12*a*) equipped with a high frequency transmitting circuit and the cavity (such as 12*b*) equipped with a high frequency receiving circuit, and by connecting both cavities (such as 12*a* and 12*b*).

The bias and control signals, although omitted from the figure, from the bias and control signal bonding pads 17 are connected to the bias and control signal pads 15 via the dielectric substrate 6, between and within the layers, through the bias and control signal through-holes 18, the bias and control signal wiring 19, and so forth, and are transferred with an external circuit in a manner identical to that shown in FIG. 4 for Embodiment 1. The cover 11 may be joined on the laminated seal 8 by, for example, bonding, soldering, or welding, to thereby seal the cavity.

As a result, a high frequency module, heretofore configured with the conventional plurality of packages, can be integrally configured to eliminate the connection lines between packages, thereby enabling miniaturization of the high frequency module, streamlining of assembly operations, performance improvement, cost reduction, and so forth. Furthermore, using the microstrip line-waveguide converter 21 for carrying signals on the front and back sides of the dielectric substrate obviates the feed-through 14 so that the configuration can be simplified and the signal loss due to the feed-through 14 can be reduced. In addition, the machining of the tunnel-shaped slot in the seal 8 can suppress the coupling of the high frequency signals between cavities, thereby enabling further improvement in characteristics.

Embodiment 4

Figure 7:
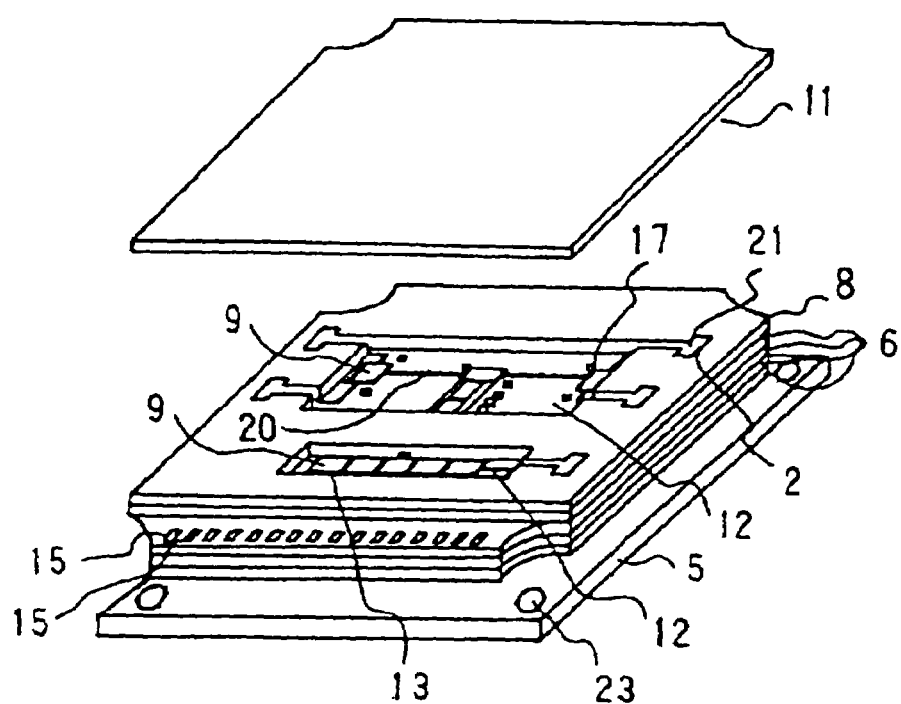
FIG. 7 is a perspective view of a high frequency module according to an Embodiment 4 of the present invention.

FIG. 7 is a perspective view of a high frequency module representing Embodiment 4 of the present invention, and components in the figure corresponding to those of the above-described embodiments are designated with identical reference numerals. In the figure, a carrier is designated by reference numeral 5.

The configuration and function will be described next. The carrier 5 has fastening screw holes 23 for fastening the high frequency module with screws. The carrier 5 is joined at its periphery to the bottom of the lowest layer of the laminated dielectric substrate 6 by brazing, soldering, bonding, or the like.

As a result, in addition to obtaining the advantages of Embodiment 3, the use of the carrier 5 increases the degree of freedom for mechanically fastening, for example, an antenna (not shown in the figure). Because the high frequency module can be easily fastened, the degree of freedom in design is increased and the ease of fabrication is improved. It should be noted that fasteners other than screws, such as another tightening member or a holding component for holding the side surface of the carrier 5, may be used.

Embodiment 5

Figure 8:
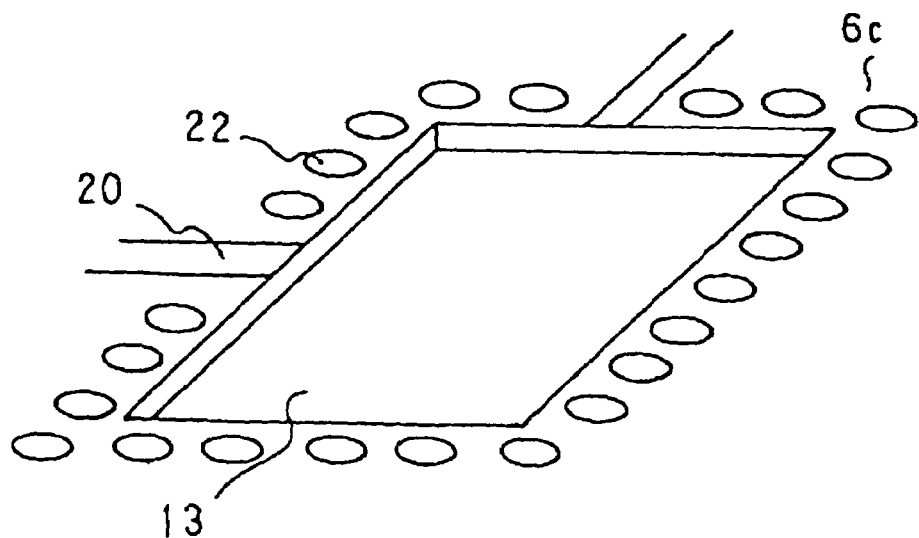
FIG. 8 is a perspective view of a cavity of a high. frequency module according to an Embodiment 5 of the present invention.

FIG. 8 is a perspective view of a high frequency module representing Embodiment 5 of the present invention, and in the figure are shown a second cavity 13, an RF line 20, and a ground conduction through-hole 22.

The configuration and function will be described next. In the figure, the second cavity 13 forming a part of the high frequency module has its entire bottom surface metallized with a metal conductor, and up to the periphery of the side is wired the RF line 20 on the top surface of the dielectric substrate 6c. In the periphery of the second cavity 13, except near the RF line 20, the ground conduction through-holes 22 are positioned, either, as shown in the figure, in one row or in a plurality of rows. This configuration suppresses the coupling of the high frequency signals between the cavity 13 and the other cavities. It should be noted that when the ground conduction through-holes 22 are positioned at a spacing to interrupt the passage of signals according to the wavelength of the signals to be suppressed, the number of ground conduction through-holes 22 can be reduced. Thus, when the wavelength of the signals to be suppressed is denoted as $\lambda$, it is preferable to position the ground conduction through-holes 22 at a spacing of $\lambda/4$ or less.

As a result, the same advantages described for Embodiments 1 to 4 can be obtained by applying the second cavity 13 according to the present embodiment to Embodiments 1 to 4.

Embodiment 6

Figure 9:
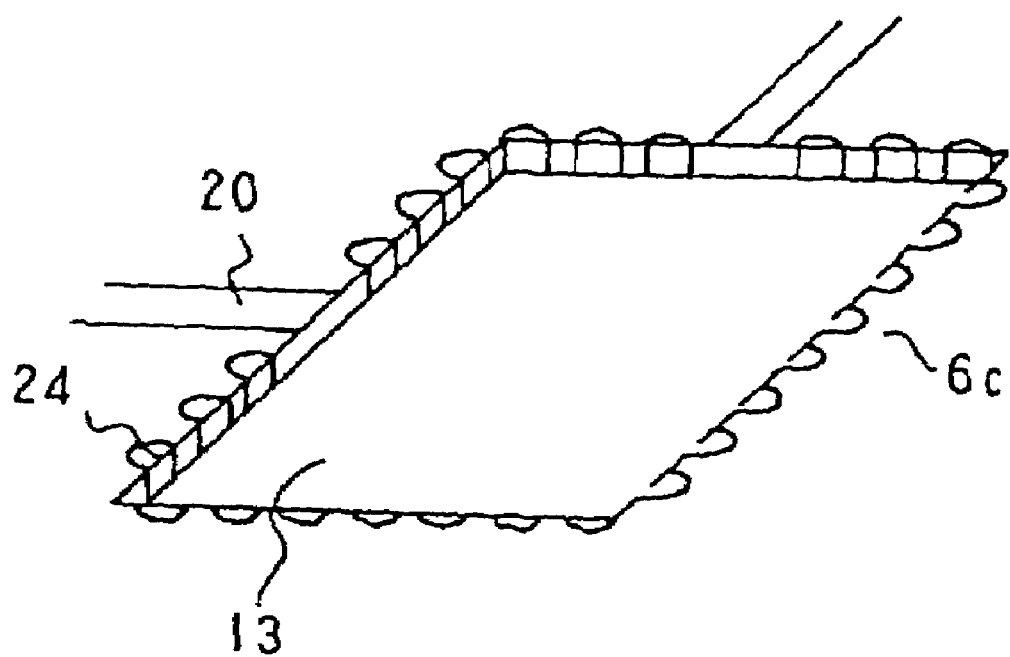
FIG. 9 is a perspective view of a cavity of a high frequency module according to an Embodiment 6 of the present invention.

FIG. 9 is a perspective view of a cavity of a high frequency module representing Embodiment 6 of the present invention, and in the figure are shown a second cavity 13, an RF line 20, and ground conduction through-holes 24 split vertically in half.

The configuration and function will be described next. In the figure, the second cavity 13 forming a part of the high frequency module has its entire bottom surface metallized with a metal conductor, and up to the periphery of the side is wired the RF line 20 on the top surface of the dielectric substrate 6c. In the periphery of the second cavity 13, except near the RF line 20, are arranged ground conduction through-holes 24 having vertical semi-cylindrical shape. The through-holes 24 are positioned with their flat sides facing the cavity.

Arranging a plurality of through-holes 24 so as to enclose the cavity along the sides of the cavity periphery suppresses the coupling of the high frequency signals with the other cavities. The ground conduction through-holes 24 can be simply formed by punching hollows in the sides of the cavity periphery, when in a soft state before the dielectric substrates are laminated, and attaching and sintering metal, such as gold or silver, to the hollows during lamination. Since the through-holes can be positioned on the sides of the cavity according to this embodiment, the circumference along which the through-holes are installed is short compared to the configuration of Embodiment 5 and a reduced number of through-holes is sufficient, thereby resulting not only in more efficient fabrication, but also in lower cost. Furthermore, the precision that is required for machining the hole spacing can be relaxed compared to the through-holes of Embodiment 5.

As a result, the same advantage described for Embodiments 1 to 4 can be obtained by applying the second cavity 13 according to the present embodiment to Embodiments 1 to 4.

Embodiment 7

Figure 10:
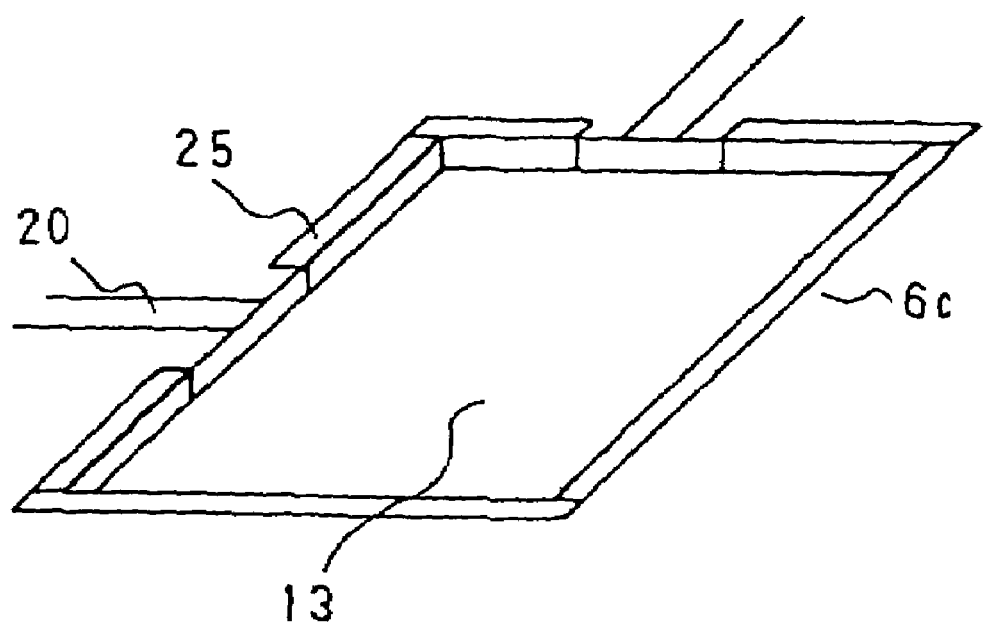
FIG. 10 is a perspective view of a cavity of a high frequency module according to an Embodiment 7 of the present invention.

FIG. 10 is a perspective view of a cavity of a high frequency module representing Embodiment 7 of the present invention, and in the figure are shown a second cavity 13, an RF line 20, and a metal conductor pattern 25 positioned on the cavity sides.

The configuration and function will be described next. In the figure, the second cavity 13 forming a part of the high frequency module has its entire bottom surface metallized with a metal conductor, and up to the periphery of the side is wired the RF line 20 on the top surface of the dielectric substrate 6c. Positioning, on the entire sides of the second cavity 13, except near the RF line 20, the metal conductor pattern 25 suppresses the coupling of the high frequency signals with the other cavities.

As a result, the same advantages described for Embodiments 1 to 4 can be obtained by applying the second cavity 13 according to the present embodiment to embodiments 1 to 4.

Embodiment 8

Figure 11:
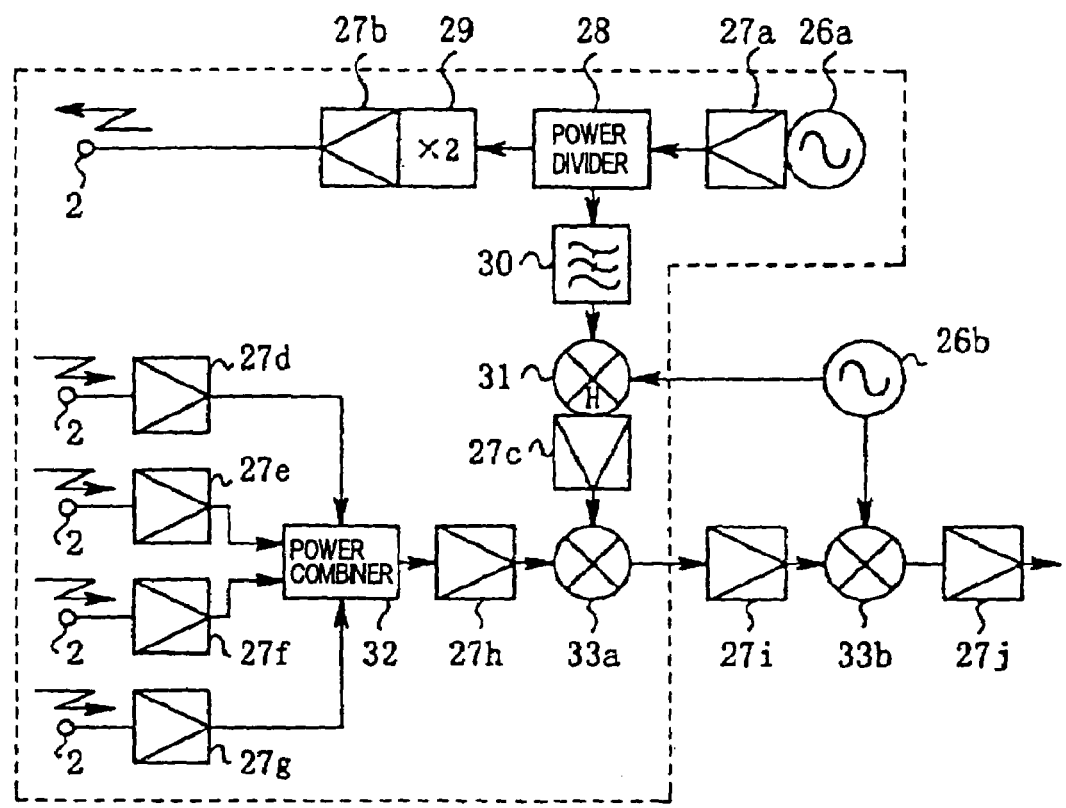
FIG. 11 is a block diagram of a high frequency circuit built into a high frequency module according to an Embodiment 8 of the present invention.

FIG. 11 is a block diagram of a high frequency circuit built into a high frequency module representing Embodiment 8 of the present invention. The high frequency circuit comprises the waveguide terminal 2, a first and a second oscillator 26a and 26b, first to tenth amplifiers 27a to 27j, a power divider 28, a multiplier 29, a filter 30, an even harmonic high frequency mixer 31 with built-in anti-parallel diode pair in which diodes of reverse polarity are connected in parallel, a power combiner 32, and a first and a second fundamental mixer 33a and 33b.

The operation will be described next. In the present example, the high frequency circuits are mounted within the high frequency module so as to form a FM-CW radar for obtaining the relative speed and range of a forward target. The operation of the various high frequency circuits will be shown hereinafter. In the figure, the first oscillator 26a outputs a high frequency modulating signal and the first amplifier 27a amplifies the power of this output. The power divider 28 divides the power of the output of the first amplifier 27a into two directions. The multiplier 29 receives one output of the power divider 28, doubles the frequency, and outputs the result. The second amplifier 27b amplifies the power of the output of the multiplier 29 and outputs a transmitting signal toward the waveguide terminal 2. The waveguide terminal 2 receives the transmitting signal through the feed-through 14, the microstrip line-waveguide converter 16, or the microstrip line-waveguide converter 21 (not shown in the figure) for carrying signals on the front and back sides of the dielectric substrate, and outputs a transmitting signal in waveguide mode to a connected transmitting antenna (not shown in the figure). The filter 30 receives the other output from the power divider 28 and outputs a signal in which undesirable wave components are suppressed. The second oscillator 26b outputs an intermediate frequency signal in two directions. The even harmonic high frequency mixer 31 outputs a signal that includes frequencies of the sum and difference of the doubled frequency of the output of the filter 30 and the frequency of one output of the second oscillator 26b. The third amplifier 27c amplifies the power of the output of the even harmonic high frequency mixer 31. Low-noise amplification of the receiving signals obtained from receiving antennas (not shown in the figure) connected to the waveguide terminals 2 is performed by the respectively connected fourth to seventh amplifiers 27d to 27g. The power combiner 32 combines the power of the receiving signals that are output from the fourth to seventh amplifiers 27d to 27g. The eighth amplifier 27h performs low-noise amplification of the output of the power combiner 32. The first fundamental mixer 33a receives and converts the frequency of the outputs of the eighth amplifier 27h and the third amplifier 27c, and outputs an IF signal having frequencies of the sum and difference of both frequencies. The ninth amplifier 27i amplifies the power of this IF signal. The second fundamental mixer 33b receives and converts the frequency of the other output of the second oscillator 26b and the output of the ninth amplifier 27i, and outputs a video signal having frequencies of the sum and difference of the frequencies of both. The tenth amplifier 27j amplifies the power of the video signal. It should be noted the fourth to seventh amplifiers 27d to 27g that are connected to the respective waveguide terminals 2 have their bias controlled ON and OFF by an external circuit (not shown in the figure). Turning ON only the amplifier connected to the desired waveguide terminal 2 enables the receiving signal to be obtained only from that terminal. Thus, only the signal from the desired receiving antenna is obtained from among the plurality of receiving antennas.

Except for the second oscillator 26b, the ninth and tenth amplifiers 27i and 27j, and the second fundamental mixer 33b among the above-mentioned high frequency circuits, the high frequency circuits (circuits within the broken line in the figure) are mounted within the high frequency module so as to configure the radar. This configuration is utilized because the second oscillator 26b, the ninth and tenth amplifiers 27i and 27j, and the second fundamental mixer 33b operate at an intermediate or low frequency band and therefore have a large size. If these components are mounted within the high frequency module, the overall size of the module will increase.

The mounting of components shown in FIG. 3, or FIGS. 5 and 6, into the high frequency module is performed as described below. The blocks 26a, 27a, 27b, 28, 29, and 30 forming the high frequency circuit of the transmitting system are mounted within the second cavity 13a, the blocks 31, 27c, 27h, 32, and 33a forming the high frequency circuit of the receiving system are mounted within the second cavity 13b, the blocks 27d and 27e are mounted within the second cavity 13c, and the blocks 27f and 27g are mounted in the second cavity 13d. The RF line 20 is connected between the second cavities 13a and 13b and between the second cavities 13b, 13c, and 13d. Furthermore, the high frequency circuits respectively mounted within the second cavities 13a, 13b, 13c, and 13d are connected with, for example, conductor ribbons or wires. Here, by arranging the fourth to seventh amplifiers 27d to 27g and the third cavities 13c and 13d in nearly symmetrical positions with respect to a third cavity 13b such that the length of the connection lines from the power divider 32, which is connected to the waveguide terminals 2 of the receiving system, to the fourth to seventh amplifiers 27d to 27g, is nearly uniform, it is possible to make uniform the receiving signal levels of the receiving channels corresponding to the fourth to seventh amplifiers 27d to 27g when the fourth to seventh amplifiers 27d to 27g are turned ON or OFF to select a receiving channel for operation corresponding to the respective amplifier 27d to 27g.

Mounting the above-mentioned high frequency circuits within the high frequency module in this manner enables the FM-CW radar, which uses a plurality of receiving antennas through switching, to be implemented in a miniature size, at low cost, and with a high performance.

Furthermore, arranging the receiving system and the transmitting system in cavities positioned in separate locations suppresses interference of the receiving system and the transmitting system. In addition, by positioning the cavities so that the low-noise amplifiers of the receiving system are arranged in symmetrical positions from the power divider, the receiving signal levels of the receiving channels become uniform and the detection accuracy of the bearing improves when this high frequency module is applied to radar apparatus.

Embodiment 9

Figure 12:
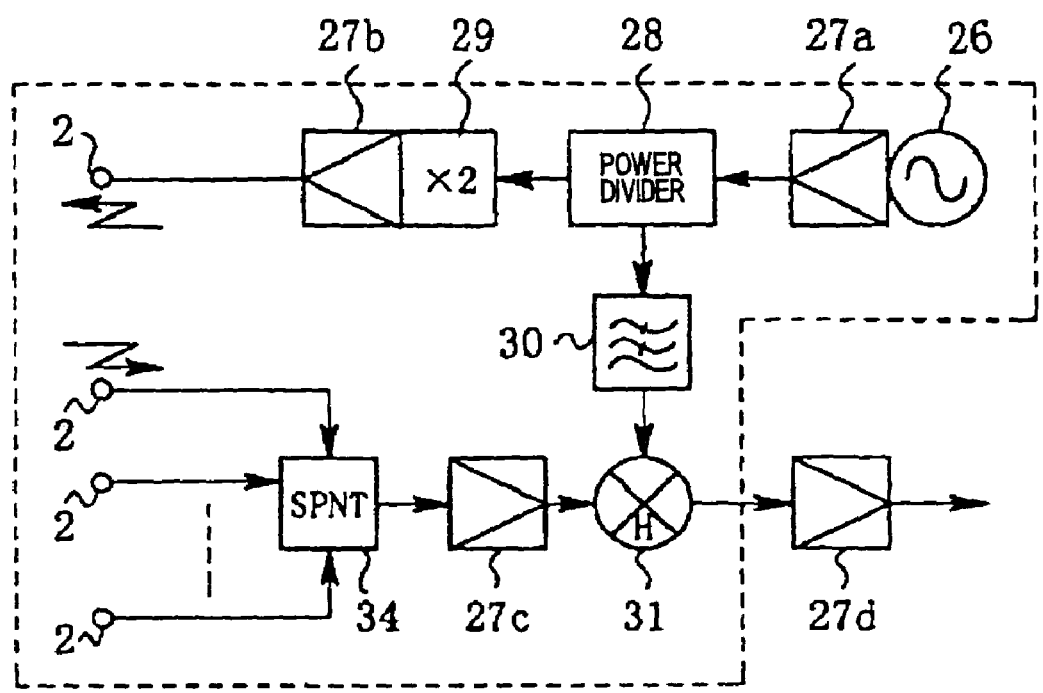
FIG. 12 is a block diagram of a high frequency circuit built into a high frequency module according to an Embodiment 9 of the present invention.

FIG. 12 is a block diagram of a high frequency circuit built into a high frequency module representing Embodiment 9 of the present invention. This high frequency circuit includes the waveguide terminals 2, the oscillator 26, the first to fourth amplifiers 27a to 27d, the power divider 28, the multiplier 29, the filter 30, the even harmonic high frequency mixer 31 with built-in anti-parallel diode pair in which diodes of reverse polarity are connected in parallel, and a switch 34 (denoted as SPNT in the figure) having a number of channels corresponding to a plurality of the waveguide terminals 2 obtaining receiving signals. It should be noted that the first to fourth amplifiers 27a to 27d do not necessarily have the same functions as the amplifiers 27a to 27d described in Embodiment 8.

The operation of the example module will be described next. In this embodiment, the high frequency circuits are mounted within the high frequency module so as to form a FM-CW radar for obtaining in particular the relative speed and range of a forward target. The operation of the various high frequency circuits will be shown hereinafter. In the figure, the oscillator 26 outputs a high frequency modulating signal and the first amplifier 27a amplifies the power of this output. The power divider 28 divides the power of the output of the first amplifier 27a into two directions. The multiplier 29 receives one output of the power divider 28, doubles the frequency, and outputs the result. The second amplifier 27b amplifies the power of the output of the multiplier 29 and outputs a transmitting signal toward the waveguide terminal 2. The waveguide terminal 2 receives the transmitting signal through the feed-through 14, the microstrip line-waveguide converter 16, or the microstrip line-waveguide converter 21 (not shown in the figure) for carrying signals on the front and back sides of the dielectric substrate, and outputs the transmitting signal in waveguide mode. The filter 30 suppresses the undesirable wave components of the other output of the power divider 28. The switch 34 has a number of channels equal to the number of connected waveguide terminals 2 and passes only the signal of the desired channel among the receiving signals obtained from receiving antennas (not shown in the figure) connected to the waveguide terminals 2. The third amplifier 27c performs low-noise amplification of the output of the switch 34. The switch 34 appropriately selects the connected waveguide terminal according to a control signal that is input from an external source through the bias and control signal bonding pads 17. The even harmonic high frequency mixer 31 outputs a video signal having frequencies of the sum and difference of the doubled frequency of the output of the filter 30 and the output frequency of the third amplifier 27c. The fourth amplifier 27d amplifies the power of this video signal.

The above-described high frequency circuits are, with the exception of the fourth amplifier 27d, mounted within the high frequency module. This configuration is employed because the fourth amplifier 7d, which operates at a low frequency band, is large. Mounting this amplifier within the high frequency module would greatly increase the overall size of the module. Furthermore, as in the example of Embodiment 9, the high frequency circuits of the receiving system and the transmitting system are respectively arranged in cavities positioned apart in separate locations. Furthermore, the RF lines are arranged so that the distance from the amplifier 27c to the waveguide terminals 2 of the receiving system is nearly uniform and so that the distance from the waveguide terminals 2 of the receiving system to the switch 34 is nearly uniform.

Mounting the above-mentioned high frequency circuits within the high frequency module in the manner described above enables configuration of a FM-CW radar, which uses a plurality of receiving antennas through switching, in a miniature size, at low cost, and with high performance.

Embodiment 10

Figure 13:
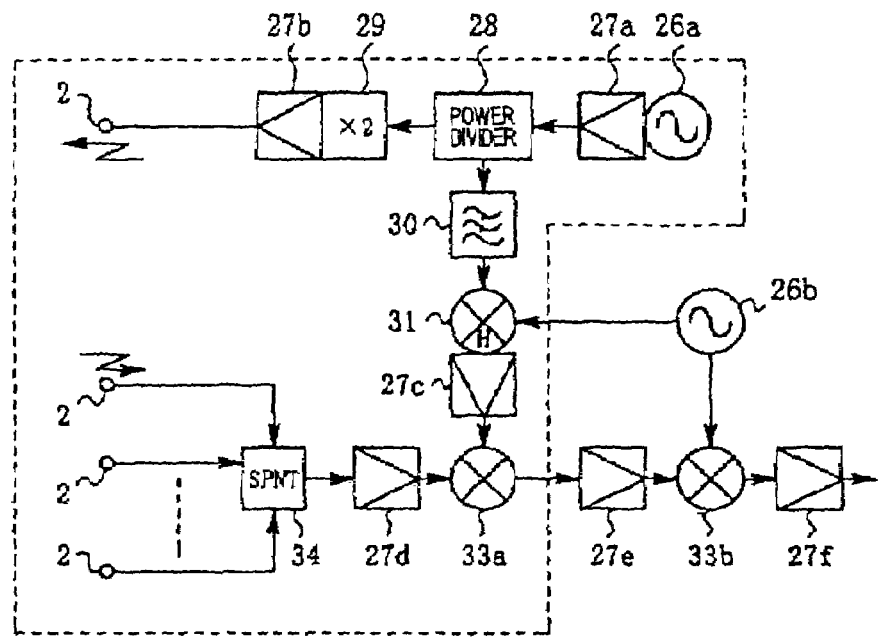
FIG. 13 is a block diagram of a high frequency circuit built into a high frequency module according to an Embodiment 10 of the present invention.

FIG. 13 is a block diagram of a high frequency circuit built into a high frequency module representing Embodiment 10 of the present invention. The high frequency circuit includes the waveguide terminals 2, the first and second oscillators 26a and 26b, the first to sixth amplifiers 27a to 27f, the power divider 28, the multiplier 29, the filter 30, the even harmonic high frequency mixer 31 with built-in anti-parallel diode pair in which diodes of reverse polarity are connected in parallel, the first and second fundamental mixers 33a and 33b, and the switch 34 (denoted as SPNT in the figure) having a number of channels equal to the number of waveguide terminals obtaining receiving signals. It should be noted that the first to sixth amplifiers 27a to 27f do not necessarily have the same functions as the amplifiers 27a to 27f of Embodiment 8.

The operation will be described next. In the present example, high frequency circuits are mounted within the high frequency module so as to form a FM-CW radar for obtaining the relative speed and range of a forward target. The operation of the various high frequency circuits will be shown hereinafter. In the figure, the first oscillator 26a outputs a high frequency modulating signal and the first amplifier 27a amplifies the power of this output. The power divider 28 divides the power of the output of the first amplifier 27a into two directions. The multiplier 29 receives one output of the power divider 28, doubles the frequency, and outputs the result. The second amplifier 27b amplifies the power of the output of the multiplier 29 and outputs a transmitting signal toward the waveguide terminal 2. The waveguide terminal 2 receives the transmitting signal through the feed-through 14, the microstrip line-waveguide converter 16, or the microstrip line-waveguide converter 21 (not shown in the figure) for carrying signals on the front and back sides of the dielectric substrate, and outputs the transmitting signal in waveguide mode. The filter 30 suppresses the undesirable wave components of the other output of the power divider 28. The second oscillator 26b outputs an intermediate frequency signal into two directions. The even harmonic high frequency mixer 31 outputs a signal having frequencies of the sum and difference of the doubled frequency of the output of the filter 30 and the frequency of one output of the second oscillator 26b. The third amplifier 27c amplifies the power of the output of the even harmonic high frequency mixer 31. The switch 34 has a number of channels equal to the number of connected waveguide terminals 2 and passes only the signal of the desired channel among the receiving signals obtained from receiving antennas (not shown in the figure) connected to the waveguide terminals 2. The switch 34 appropriately selects the connected waveguide terminal according to a control signal that is input from an external source via the bias and control signal bonding pads 17. The fourth amplifier 27d performs low-noise amplification of the output of the switch 34. The first fundamental mixer 33a receives and converts the frequency of the outputs of the fourth amplifier 27d and the third amplifier 27c, and outputs an IF signal having frequencies of the sum and difference of both frequencies. The fifth amplifier 27e amplifies the power of this IF signal. The second fundamental mixer 33b receives and converts the frequency of the other output of the second oscillator 26b and the output of the fifth amplifier 27e, and outputs a video signal having frequencies of the sum and difference of both frequencies. The sixth amplifier 27f amplifies the power of this video signal.

Except for the second oscillator 26b, the fifth and sixth amplifiers 27e and 27f, and the second fundamental mixer 33b, the high frequency circuits described above (circuits within the broken line in the figure) are mounted within the high frequency module. Because the second oscillator 26b, the fifth and sixth amplifiers 27e and 27f, and the second fundamental mixer 33b are large since they operate at an intermediate or a low frequency band, if they are mounted within the high frequency module, they will increase the overall size of the module.

Mounting the above-described high frequency circuits within the high frequency module in this manner enables the FM-CW radar, which uses a plurality of receiving antennas through switching, to be implemented in a miniature size, at low cost, and with a high performance.

Embodiment 11

Figure 14:
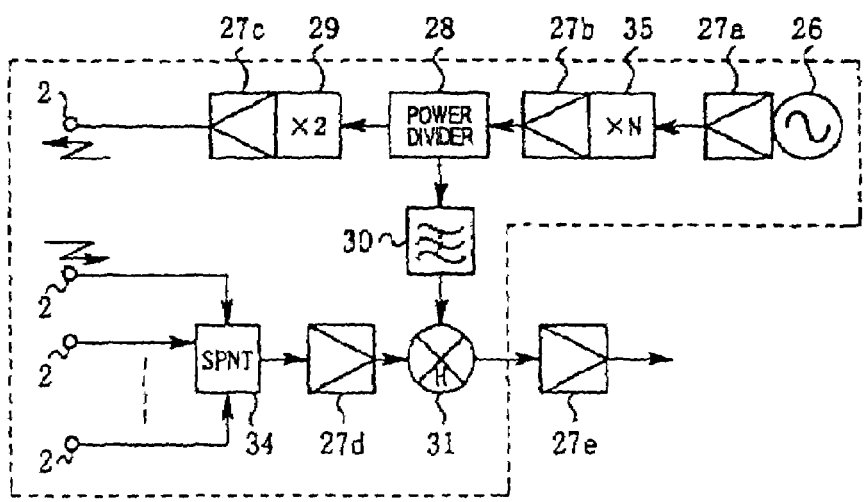
FIG. 14 is a block diagram of a high frequency circuit built into a high frequency module according to an Embodiment 11 of the present invention.

FIG. 14 is a block diagram of a high frequency circuit built into a high frequency module representing Embodiment 11 of this invention. The high frequency circuit comprises the waveguide terminals 2, the oscillator 26, the first to fifth amplifiers 27a to 27e, the power divider 28, the multiplier 29, the filter 30, the even harmonic high frequency mixer 32 with built-in anti-parallel diode pair in which diodes of reverse polarity are connected in parallel, the switch 34 (denoted as SPNT in the figure), and an N-multiplier 35. It should be noted that the first to fifth amplifiers 27a to 27e do not necessarily have the same functions as the amplifiers 27a to 27e described in previous embodiments.

The operation will be described next. The high frequency circuits are mounted within the high frequency module so as to form a FM-CW radar for obtaining the relative speed and range of a forward target. The operation of the various high frequency circuits will be shown hereinafter. In the device shown in the figure, the oscillator 26 outputs a high frequency modulating signal and the first amplifier 27a amplifies the power of this output. The N-multiplier 35 multiplies by N (where N is an integer greater than or equal to 2) the output frequency of the first amplifier 27a, and the second amplifier 27b amplifies the power of this output. The power divider 28 divides the power of the output of the second amplifier 27b into two directions. The multiplier 29 receives one output of the power divider 28, doubles the frequency, and outputs the result. The third amplifier 27c amplifies the power of the output of the multiplier 29 and outputs a transmitting signal toward the waveguide terminal 2. The waveguide terminal 2 receives the transmitting signal through the feed-through 14, the microstrip line-waveguide converter 16, or the microstrip line-waveguide converter 21 (not shown in the figure) for carrying signals on the front and back sides of the dielectric substrate, and outputs the transmitting signal in waveguide mode. The filter 30 suppresses the undesirable wave components of the other output of the power divider 28. The switch 34 has a number of channels equal to the number of connected waveguide terminals and passes only the signal of the desired channel among the receiving signals obtained from receiving antennas (not shown in the figure) connected to the waveguide terminals 2. The switch 34 appropriately selects the connected waveguide terminal according to a control signal that is input from an external source via the bias and control signal bonding pads 17. The fourth amplifier 27d performs low-noise amplification of the output of the switch 34. The even harmonic high frequency mixer 31 outputs a video signal having frequencies of the sum and difference of the doubled frequency of the output of the filter 30 and the output frequency of the fourth amplifier 27d. The fifth amplifier 27e amplifies the power of this video signal.

Except for the fifth amplifier 27e, the above-described high frequency circuits (circuits within the broken line in the figure) are mounted within the high frequency module to configure the radar. The fifth amplifier 27e is externally mounted because it operates at a low frequency band and therefore has a large size. Mounting this component within the high frequency module would increase the size of the module.

Mounting the remaining frequency circuits within the high frequency module enables the FM-CW radar, which uses a plurality of receiving antennas through switching, to be implemented in a miniature size, at low cost, and with high performance.

Embodiment 12

Figure 15:
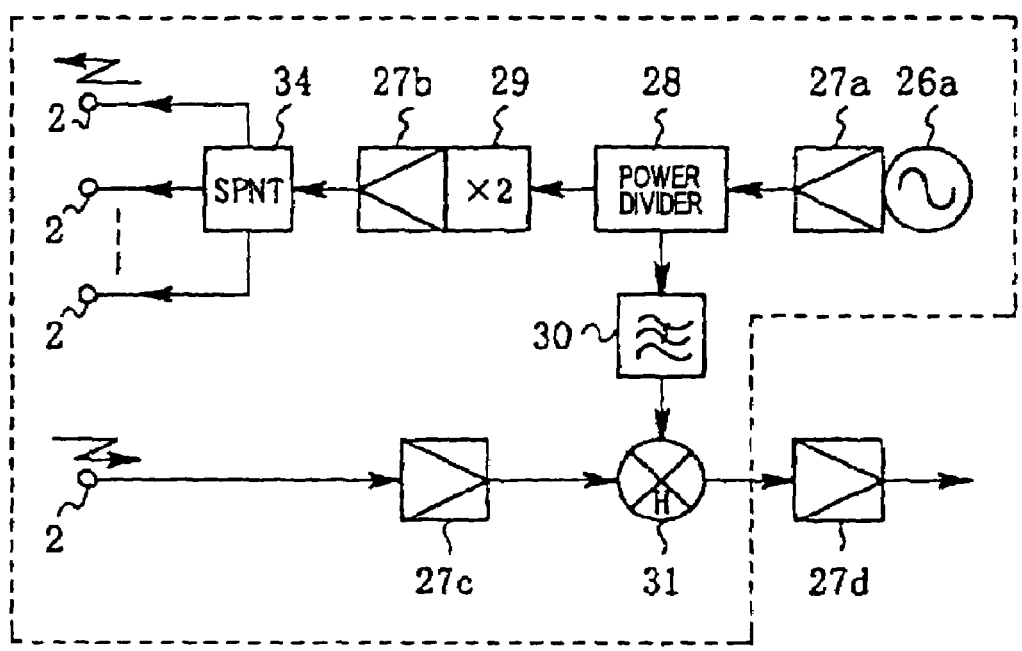
FIG. 15 is a block diagram of the high frequency circuit built into a high frequency module according to an Embodiment 12 of the present invention.

FIG. 15 is a block diagram of a high frequency circuit built into a high frequency module representing Embodiment 12 of this invention. The high frequency circuit comprises the waveguide terminals 2, the oscillator 26, the first to fourth amplifiers 27a to 27d, the power divider 28, the multiplier 29, the filter 30, the even harmonic high frequency mixer 30 with built-in anti-parallel diode pair in which diodes of reverse polarity are connected in parallel, and the switch 34 (denoted as SPNT in the figure) having a number of channels equal to the number of waveguide terminals 2 outputting transmitting signals. It should be noted that the first to fourth amplifiers 27a to 27d do not necessarily have the same functions as the amplifiers 27a to 27d described in connection with previous embodiments.

The operation will be described next. The high frequency circuits are mounted within the high frequency module so as to form a FM-CW radar for obtaining the relative speed and range of a forward target. The operation of the various high frequency circuits will be shown hereinafter. In the figure, the oscillator 26a outputs a high frequency modulating signal and the first amplifier 27a amplifies the power of this output. The power divider 28 splits into two directions the power of the output of the first amplifier 27a. The multiplier 29 receives one output of the power divider 28, doubles the frequency, and outputs the result. The second amplifier 27b amplifies the power of the output of the multiplier 29 and outputs a transmitting signal toward the waveguide terminals 2. The switch 34 has a number of channels equal to the number of connected waveguide terminals 2 and outputs a transmitting signal only to the waveguide terminal 2 of the desired channel so that the target (not shown in the figure) is illuminated by the transmitting signal from the desired antenna among the transmitting antennas (not shown in the figure) connected to the respective waveguide terminals 2. The switch 34 appropriately selects the connected waveguide terminal according to a control signal that is input from an external source through the bias and control signal bonding pads 17. The waveguide terminal 2 receives the transmitting signal through the feed-through 14, the microstrip line-waveguide converter 16, or the microstrip line-waveguide converter 21 (not shown in the figure) for carrying signals on the front and back sides of the dielectric substrate, and outputs the transmitting signal in waveguide mode. The filter 30 suppresses the undesirable wave components of the other output of the power divider 28. The third amplifier 27c performs low-noise amplification of the receiving signal obtained from the waveguide terminal 2. The even harmonic high frequency mixer 31 outputs a video signal having frequencies of the sum and difference of the doubled frequency of the output of the filter 30 and the output frequency of the third amplifier 27c. The fourth amplifier 27d amplifies the power of this video signal.

Other than the fourth amplifier 27*d*, the high frequency circuits (circuits within the broken line in the figure) are all mounted within the high frequency module so as to configure the radar. The fourth amplifier 27*d*, being large because it operates at a low frequency band, would increase the overall size of the module if mounted internally.

Mounting the remaining high frequency circuits within the high frequency module in this manner enables the FM-CW radar, which uses a plurality of transmitting antennas through switching, to be implemented in a miniature size, at low cost, and with high performance.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A high frequency module comprising:
   a first dielectric substrate provided with a first waveguide and a second waveguide;
   a second dielectric substrate laminated on said first dielectric substrate and provided with a first cavity and a second cavity, disposed so as to be separate from each other, and said first and second waveguides;
   a third dielectric substrate laminated on said second dielectric substrate and having a third cavity, inside of which is positioned said first cavity, and a fourth cavity, inside of which is positioned said second cavity, disposed apart from said third cavity;
   a metal conductor provided so as to seal said third and fourth cavities;
   a plurality of first high frequency circuits installed within said first cavity;
   a plurality of second high frequency circuits installed within said second cavity;
   a first connection line connecting between said first and second high frequency circuits;
   a second and third connection line respectively connecting said first and second high frequency circuits with said first and second waveguides; and wherein
   said first and second waveguides are respectively formed by a through-hole provided in said first and second dielectric substrates.

2. The high frequency module according to claim 1, further comprising:
   an oscillator for outputting high frequency modulating signal;
   a power divider for dividing a power of the output of said oscillator;
   a multiplier for doubling a frequency of one output of said power divider and outputting a transmitting signal;
   a switch having a number of channels corresponding to a plurality of waveguides obtaining receiving signals and capable of selecting said waveguide; and
   an even harmonic high frequency mixer for outputting a video signal having frequencies of a sum and difference of the doubled frequency of the other output of said power divider and an output frequency of said switch; wherein
   said oscillator, power divider, multiplier, switch, and even harmonic high frequency mixer are mounted within said first and second cavities in said high frequency module.

3. The high frequency module according to claim 1, further comprising:
   a first oscillator for outputting a high frequency modulating signal;
   a power divider for dividing a power of the output of the first oscillator;
   a multiplier for doubling a frequency of one output of said power divider and outputting a transmitting signal;
   a second oscillator for outputting an intermediate frequency signal into two directions;
   an even harmonic high frequency mixer for outputting a signal having frequencies of a sum and difference of the doubled frequency of the other output of said power divider and an output frequency of said second oscillator;
   a switch having a number of channels corresponding to a plurality of waveguides obtaining receiving signals and capable of selecting said waveguide;
   a first fundamental mixer for receiving and converting a frequency of the output of said switch and the output of said even harmonic high frequency mixer and outputting an IF signal; and
   a second fundamental mixer for receiving and converting a frequency of the IF signal that is output from said fundamental mixer and the other output of said second oscillator and outputting a video signal; wherein
   said first oscillator, power divider, multiplier, even harmonic high frequency mixer, switch, and first fundamental mixer are mounted within said first and second cavities in said high frequency module.

4. The high frequency module according to claim 1, further comprising:
   an oscillator for outputting a high frequency modulating signal;
   an N-multiplier for multiplying by N (where N is an integer greater than or equal to 2) an output frequency of said oscillator;
   a power divider for dividing a power of an output of said N-multiplier;
   a multiplier for doubling a frequency of one output of said power divider and outputting a transmitting signal;
   a switch having a number of channels corresponding to a plurality of waveguides obtaining receiving signals and capable of selecting said waveguide; and
   an even harmonic high frequency mixer for outputting a video signal having frequencies of a sum and difference of the doubled frequency of the other output of said power divider and a frequency of a receiving signal obtained through said switch; wherein
   said oscillator, power divider, multiplier, N-multiplier, switch, and even harmonic high frequency mixer are mounted within said first and second cavities in said high frequency module.

5. The high frequency module according to claim 1, further comprising:
   an oscillator for outputting a high frequency modulating signal;
   a power divider for dividing a power of the output of said oscillator;
   a multiplier for doubling a frequency of one output of said power divider and outputting a transmitting signal;
   a switch having a number of channels corresponding to a plurality of waveguides for outputting transmitting signals and capable of selecting said waveguide and conducting the transmitting signal; and
   an even harmonic high frequency mixer for outputting a video signal having frequencies of a sum and difference of the doubled frequency of the other output of said power divider and frequency of receiving signal obtained from waveguide differing from said waveguide; wherein said oscillator, power divider, multiplier, switch, and even harmonic high frequency mixer are mounted within said first and second cavities in said high frequency module.

6. The high frequency module according to claim 2, wherein said even harmonic high frequency mixer comprises a built-in anti-parallel diode pair connecting in parallel two diodes of reverse polarity.

7. A high frequency module comprising:
a first dielectric substrate provided with a first waveguide and a second waveguide;
a second dielectric substrate laminated on said first dielectric substrate and provided with a first cavity and a second cavity disposed so as to be separate from each other, and said first and second waveguides;
a metal conductor having a third cavity, inside of which is positioned said first cavity, and a fourth cavity inside of which is positioned said second cavity, disposed apart from said third cavity;
a plurality of first high frequency circuits installed within said first cavity;
a plurality of second high frequency circuit installed within said second cavity;
a first connection line connecting between said first and second high frequency circuits;
second and third connection lines for respectively connecting said first and second high frequency circuits with said first and second waveguides; and wherein
said first and second waveguide formed by through-hole provided in said first and second dielectric substrates.

8. A high frequency module comprising:
a first dielectric substrate provided with a first waveguide and a second waveguide;
a second dielectric substrate laminated on said first dielectric substrate and provided with a first cavity and a second cavity, disposed so as to be separate from each other, and said first and second waveguides;
a third dielectric substrate laminated on said second dielectric substrate and having a third cavity, inside of which is positioned said first cavity, and a fourth cavity, inside of which is positioned said second cavity, disposed apart from said third cavity, with said first and second waveguides;
a metal conductor provided so as to seal said third and fourth cavities;
a plurality of first high frequency circuits installed within said first cavity;
a plurality of second high frequency circuits installed within said second cavity;
a first connection line connecting between said first and second high frequency circuits;
second and third connection lines respectively connecting said first and second high frequency circuits with said first and second waveguides; and wherein
one cavity among said first to fourth cavities is provided with a plurality of holes having continuity to ground at a periphery of the cavity; and
said holes are through-holes split vertically in half and embedded in the periphery of the cavity.

9. A high frequency module comprising:
a first dielectric substrate provided with a first waveguide and a second waveguide;
a second dielectric substrate laminated on said first dielectric substrate and provided with a first cavity and a second cavity, disposed so as to be separate from each other, and said first and second waveguides;
a metal conductor having a third cavity, inside of which is positioned said first cavity, and a fourth cavity inside of which is positioned said second cavity, disposed apart from said third cavity;
a plurality of first high frequency circuits installed within said first cavity;
a plurality of second high frequency circuits installed within said second cavity;
a first connection line connecting between said first and second high frequency circuits;
second and third connection lines for respectively connecting said first and second high frequency circuits with said first and second waveguides; and
through-holes split vertically in half and embedded in the periphery of the cavity.

* * * * *